(12) United States Patent
Liang et al.

(10) Patent No.: US 12,402,262 B2
(45) Date of Patent: Aug. 26, 2025

(54) ELECTRONIC DEVICE

(71) Applicant: Huawei Digital Power Technologies Co., Ltd., Shenzhen (CN)

(72) Inventors: Zhanfeng Liang, Xi'an (CN); Zhangrui Chen, Shanghai (CN); Maofan Li, Dongguan (CN); Lin Liu, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 183 days.

(21) Appl. No.: 18/467,007

(22) Filed: Sep. 14, 2023

(65) Prior Publication Data
US 2024/0090146 A1 Mar. 14, 2024

(30) Foreign Application Priority Data
Sep. 14, 2022 (CN) .......................... 202222448927.4

(51) Int. Cl.
*H05K 5/02* (2006.01)
*H05K 5/00* (2025.01)
*H05K 5/03* (2006.01)

(52) U.S. Cl.
CPC ......... *H05K 5/0217* (2013.01); *H05K 5/0069* (2013.01); *H05K 5/0214* (2022.08); *H05K 5/0247* (2013.01); *H05K 5/03* (2013.01)

(58) Field of Classification Search
CPC ....................................................... H05K 7/00
See application file for complete search history.

(56) References Cited

U.S. PATENT DOCUMENTS

2006/0260341 A1* 11/2006 Meyvis .................. B01D 46/12
62/331

FOREIGN PATENT DOCUMENTS

| CN | 204030998 U | 12/2014 |
|----|-------------|---------|
| CN | 205407617 U | 7/2016 |
| CN | 207184343 U | 4/2018 |
| CN | 105609680 B | 6/2018 |
| CN | 214799314 U | 11/2021 |
| CN | 216312968 U | 4/2022 |

* cited by examiner

*Primary Examiner* — Jerry Wu
(74) *Attorney, Agent, or Firm* — Maier & Maier, PLLC

(57) ABSTRACT

An electronic device includes a lower housing and an upper cover that are connected to each other. The upper cover has a bending structure that faces a direction of the lower housing, an end that is of the lower housing and that faces the upper cover has a flanging structure, the flanging structure overlaps a bottom wall of the bending structure, and the upper cover and the lower housing are connected at an overlapping part of the bending structure and the flanging structure.

9 Claims, 5 Drawing Sheets

ELECTRONIC DEVICE

CROSS-REFERENCE TO RELATED APPLICATIONS

This application claims priority to Chinese Patent Application No. 202222448927.4, filed on Sep. 14, 2022, which is hereby incorporated by reference in its entirety.

TECHNICAL FIELD

The embodiments relate to the field of electronic technologies, and an electronic device.

BACKGROUND

With continuous development and update of electronic technologies, electronic devices with energy storage functionality, for example, an inverter, a power distribution box, a switch box, and the like, are increasingly widely applied. An inverter is used as an example. The inverter is a converter that may convert direct current energy into a constant-frequency constant-voltage alternating current or a frequency-modulation voltage-regulation alternating current. The inverter includes a photovoltaic inverter. The photovoltaic inverter is an inverter that may convert a variable direct current generated by a photovoltaic solar panel into a mains frequency alternating current. The photovoltaic inverter may feed back the alternating current obtained through conversion to commercial transmission systems or to off-grid power grids for use.

The foregoing electronic device may include a lower housing and an upper cover that covers the lower housing. The upper cover and the lower housing may be connected and fastened by using a fastener (for example, a bolt, a screw, a machine screw, or the like), to improve firmness and reliability of connection between the upper cover and the lower housing. A screw fastening manner is used as an example. A mounting hole may be provided on a front surface or a side surface of the upper cover, and a threaded hole opposite the mounting hole is provided on the lower housing. In a connection process, a screw fastener may pass through the mounting hole of the upper cover, and then be screwed into the threaded hole of the lower housing, so that the upper cover and the lower housing are connected through the screw fastener.

However, in the foregoing connection manner, the screw fastener is located on the front surface or the side surface of the upper cover; consequently, an appearance effect of the electronic device is relatively poor, and overall aesthetics of the electronic device is reduced.

SUMMARY

The embodiments may provide an electronic device to resolve a problem that an appearance of the electronic device is relatively poor and overall aesthetics of the electronic device is reduced because a connection manner between an upper cover and a lower housing causes a screw fastener to be located on a front surface or a side surface of the upper cover in an existing electronic device.

An electronic device includes a lower housing and an upper cover that are connected to each other.

The upper cover has a bending structure that faces a direction of the lower housing, an end that is of the lower housing and that faces the upper cover has a flanging structure, the flanging structure overlaps a bottom wall of the bending structure, and the upper cover and the lower housing are connected at an overlapping part of the bending structure and the flanging structure.

The upper cover and the lower housing are connected at an overlapping part of the flanging structure and the bottom wall of the bending structure, so that a connection structure between the upper cover and the lower housing may be hidden at the bottom of the upper cover. This effectively avoids occurrence of the connection structure on a side surface or a front surface of the upper cover, and avoids impact on an appearance of the electronic device caused by the occurrence of the connection structure on the front surface or the side surface of the upper cover, thereby effectively improving external integrity of the electronic device, and improving overall aesthetics of the electronic device.

In addition, the upper cover has the bending structure, and the bending structure may cause the upper cover to deform when an inner part of the electronic device is affected by an energy shock, to increase a volume of a cavity inside the electronic device, thereby providing buffer space for the energy shock, effectively avoiding a crack between the upper cover and the lower housing, avoiding occurrence of a security accident, and effectively improving security of the electronic device.

In a possible implementation, a fastening assembly is further included. The bottom wall of the bending structure and the flanging structure are connected at the overlapping part by using the fastening assembly. A connection manner structure of the fastening assembly is simple. This may simplify a connection on the upper cover and the lower housing. In addition, the fastening assembly provides reliable connection and is easy to disassemble. This may effectively improve reliability and firmness of connection between the upper cover and the lower housing, and may further facilitate disassembly between the upper cover and the lower housing, thereby facilitating repair and maintenance of the electronic device.

In a possible implementation, the fastening assembly includes a bolt component and a nut component that fit with each other.

A first assembly hole is provided on the bottom wall of the bending structure, a second assembly hole opposite to the first assembly hole is provided on the flanging structure, and a stud of the bolt component passes through the first assembly hole and the second assembly hole and fits with the nut component.

One of the bolt component and the nut component is fastened to an inner side of the bottom wall of the bending structure. In this way, when the nut component and the bolt component are fastened and fitted, only one of the fastener needs to be rotated to implement fastening and fitting of the nut component and the bolt component, and no auxiliary fastening is required for a fastening assembly fastened to the inner side of the bottom wall. This effectively reduces operation difficulty of fitting the fastening assemblies, improves tightness of fitting the fastener, and improves firmness and reliability of connection between the upper cover and the lower housing.

In a possible implementation, the nut component is a self-clinching nut or a rivet nut, and the nut component is fastened to the inner side of the bottom wall and is coaxially disposed with the first assembly hole.

The stud of the bolt component sequentially passes through the second assembly hole and the first assembly hole and fits with the nut component. In this way, in a connection process, the stud of the bolt component is extended into the nut component and rotated, so that the bolt component and the nut component may be fastened and fitted, and the nut component does not need to be fastened. This effectively avoids rotation of the nut component with the bolt component in a process of fitting with the bolt component, and avoids affecting normal fitting between the nut component and the bolt component caused by the rotation of the nut component with the bolt component, thereby effectively improving tightness of fitting the nut component and the bolt component, and improving firmness and reliability of connection between the upper cover and the lower housing.

In addition, fastened connection operations between the bending structure and each of the self-clinching nut and the rivet nut are simple, and the connections are reliable and cause no damage or harm to an overall structure of the upper cover. This can effectively improve firmness and reliability of a connection between the nut component and the bottom wall, thereby improving reliability and stability of connection between the upper cover and the lower housing.

In a possible implementation, the bolt component is a self-clinching bolt or a rivet bolt, a head of the bolt component is fastened to the inner side of the bottom wall, and the stud of the bolt component sequentially passes through the first assembly hole and the second assembly hole and extends out of an outer side of the flanging structure, to fit with the nut component. In this way, in a connection process, the nut component may be directly sleeved on the stud of the bolt component and the nut component is rotated, so that the nut component and the bolt component may be fastened and fitted, and the bolt component does not need to be fastened. This effectively avoids rotation of the bolt component in a process of fitting with the nut component, and avoids affecting normal fitting between the bolt component and the nut component caused by the rotation of the bolt component with the nut component, thereby effectively improving tightness of fitting the bolt component and the nut component, and improving firmness and reliability of connection between the upper cover and the lower housing.

In a possible implementation, a sealing element is further included. The sealing element is disposed between the upper cover and the lower housing. The sealing element may play a sealing role for connection between the upper cover and the lower housing, avoid entering of external stains such as water stains and oil stains into the cavity of the electronic device, and prevent the foregoing stains from entering the cavity to affect normal operation of the electronic device, thereby helping improve stability and security of operation of the electronic device.

In a possible implementation, the flanging structure has a first flip surface parallel to the bottom wall of the bending structure, and the bottom wall of the bending structure is bonded to the first flip surface.

The bending structure and the flanging structure are connected at an overlapping part of the first flip surface and the bottom wall. In this way, the first flip surface may be more closely attached to the bottom wall, a fitting and attachment degree between the bending structure and the flanging structure can be effectively improved, and a coaxiality between the first assembly hole and the second assembly hole can be improved, thereby facilitating fastening and fitting between the bolt component and the nut component, helping improve firmness and reliability of fitting between the nut component and the bolt component, and improving reliability and stability of connection between the upper cover and the lower housing.

In a possible implementation, a side wall of the lower housing is flipped outwards to form the flanging structure.

The lower housing and the upper cover are enclosed to form a cavity, the flanging structure is concave towards a direction of the cavity to form a recess part, and the recess part is configured to protrude outwards when an impact force is exerted inside the lower housing, to increase a volume of the cavity. In this way, buffer space can be provided for an energy shock in the cavity, thereby effectively reducing a pulling force at a connection part between the upper cover and the lower housing, effectively reducing or avoiding a crack between the upper cover and the lower housing, preventing a security accident caused by the crack between the upper cover and the lower housing, and effectively improving security of the electronic device.

In a possible implementation, the flanging structure further includes a second flip surface connected to the first flip surface.

The second flip surface is located on a side that is of the first flip surface and that is close to the side wall of the lower housing, and the second flip surface is located on a side that is of the first flip surface and that faces the cavity, to enable the second flip surface to be concave towards the cavity to form the recess part.

In a possible implementation, the sealing element is located between the second flip surface and the upper cover. The second flip surface is located on a side that is of the first flip surface and that is close to the upper cover, so that a distance between the second flip surface and the upper cover is relatively small. In this way, a compression amount of the sealing element may be effectively increased, and a sealing effect of connections between the sealing element and each of the upper cover and the lower housing is improved, thereby effectively improving sealing performance between the upper cover and the lower housing. In addition, this further helps improve firmness and reliability of setting the sealing element, effectively reduce or avoid deviation of the sealing element, and improve reliability and stability of sealing between the upper cover and the lower housing.

In a possible implementation, the flanging structure is enclosed around a periphery of a side wall of the lower housing. The sealing element is clamped at an end that is of the side wall of the lower housing and that faces the upper cover.

In a possible implementation, the electronic device is a photovoltaic inverter, which includes module terminals, a circuit board, power components, a fan, and a lower shell and an upper cover connected with each other. The power components and the fan are installed on the circuit board. The circuit board is mounted on a side wall or bottom wall of the lower housing. The module terminals are disposed on a side wall or a bottom wall of the lower housing, a part of the module terminals located outside the lower housing is configured to connect to a photovoltaic module, and a part of the module terminals located inside the lower housing is configured to connect to the circuit board and transmitting power of the photovoltaic module to the power component through the circuit board. The upper cover has a bending structure facing the lower housing, and an end of the lower housing facing the upper cover has a flanging structure, and the flanging structure overlaps a bottom wall of the bending structure. The upper cover is connected to the lower housing at a position at which the bending structure overlaps the flanging structure, so that a sealed accommodating cavity is formed between the upper cover and the lower housing, and the heat dissipation fan forms internal circulating heat dissipation air in the sealed accommodating cavity so as to evenly distribute heat generated by the power components in the sealed accommodation cavity, and prevent dust outside the cavity from entering the sealed accommodation cavity and affecting the power components.

DETAILED DESCRIPTION OF THE EMBODIMENTS

Terms used in the embodiments are only used to explain but are not intended as limiting.

For ease of understanding, related terms in the embodiments are first explained and described.

Figure 1:
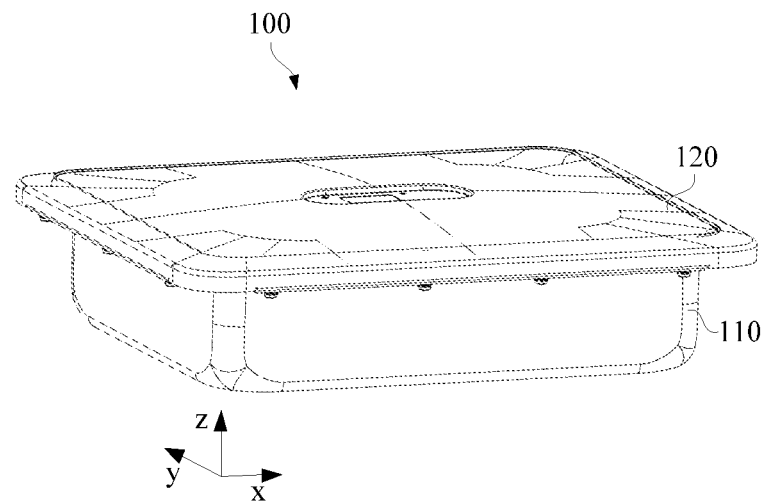
FIG. 1 is a schematic diagram of a structure of an electronic device according to an embodiment.
Figure 1A:
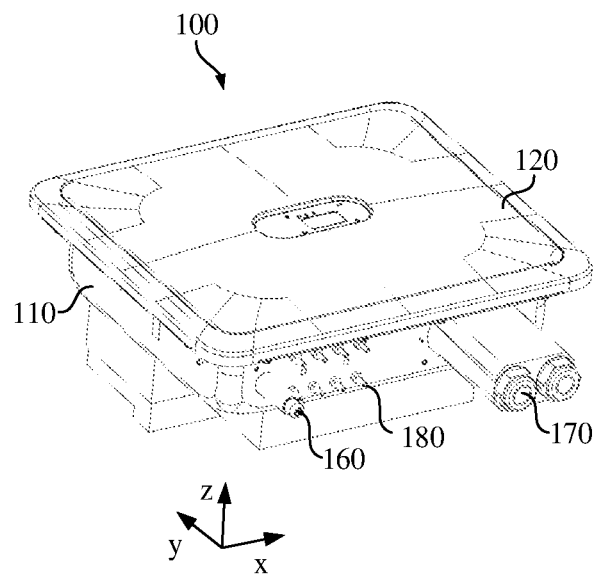
FIG. 1a is a schematic diagram of a structure of connection between an electronic device and a connector according to an embodiment.

FIG. 1 is a schematic diagram of a structure of an electronic device according to an embodiment. FIG. 1a is a schematic diagram of a structure of a connection between the electronic device and a connector according to this embodiment.

This embodiment provides the electronic device. The electronic device may be an inverter, for example, a photovoltaic inverter, or the electronic device may be an electronic device configured to store energy, for example, a power distribution box, a switch box, or the like. For example, the electronic device may be configured to store electric energy, thermal energy, light energy, and the like. The following uses an example in which the electronic device is a photovoltaic inverter for description.

Figure 1B:
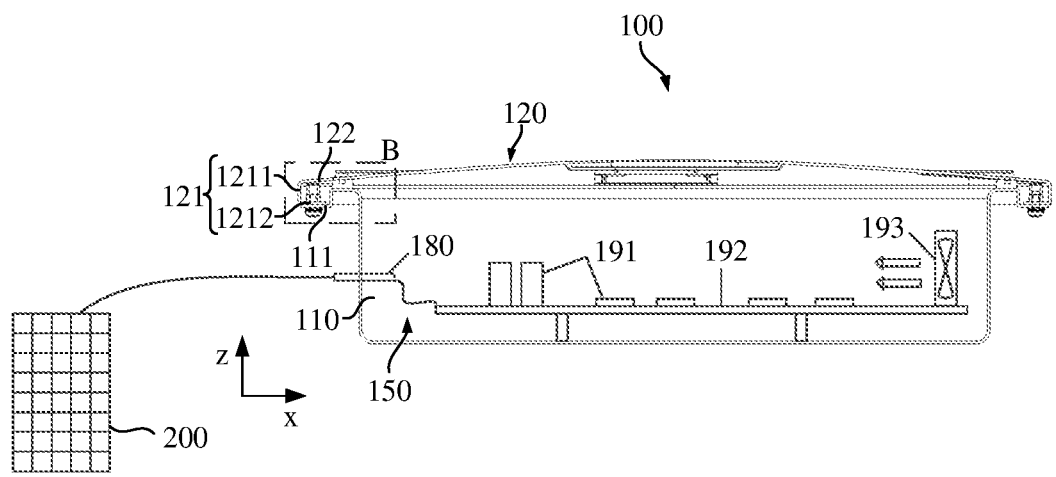
FIG. 1b is a schematic diagram of an application scenario of an electronic device according to an embodiment.
Figure 3:
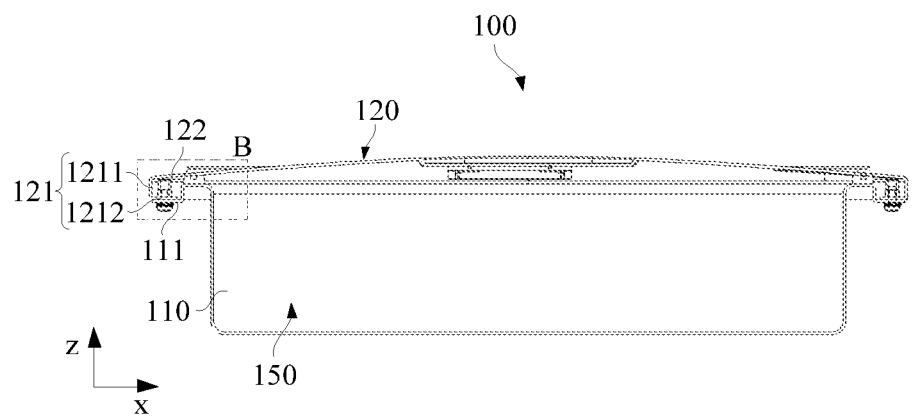
FIG. 3 is a sectional view of an electronic device according to an embodiment.

As shown in FIG. 1, the electronic device 100 may include a lower housing 110 and an upper cover 120 that are connected to each other. The lower housing 110 and the upper cover 120 may be enclosed to form a sealed cavity 150 (as shown in FIG. 3). A mechanical part configured to implement a complete function of the electronic device 100 may be disposed in the cavity 150. For example, a mechanical part such as a circuit board, an inductor, a relay, a fuse, a power switch, a heat sink, or the like may be disposed in the cavity 150, so that the electronic device 100 may implement the function of the electronic device 100 by using the foregoing mechanical part. For example, when the electronic device 100 is a photovoltaic inverter, further referring to FIG. 1 and FIG. 1a and FIG. 1b, the photovoltaic inverter 100 includes a lower housing 110 and an upper cover 120 that are connected to each other that are shown in FIG. 1. Further, as shown in FIG. 1a and FIG. 1b, the photovoltaic inverter 100 further includes a module terminals 180, power components 191, a circuit board 192, and a fan 193. The power components 191 and the fan 193 are mounted on the circuit board 192, and the circuit board 192 is accommodated and mounted and fixed in the lower housing 110. The module terminals 180 are disposed on a side wall or a bottom wall of the lower housing 110, a part of the module terminals 180 located outside the lower housing 110 is configured to connect the photovoltaic module 200, and a part of the module terminals 180 located inside the lower housing 110 is configured to connect the circuit board 192. The power of the photovoltaic module 200 is transmitted to the power components 191 through the circuit board 192. The upper cover 120 has a bending structure facing the lower housing 110, an end of the lower housing 110 facing the upper cover 120 has a flanging structure 111, and the flanging structure 111 overlaps a bottom wall of the bending structure 121. The upper cover 120 is connected to the lower housing 110 at a position at which the bending structure 121 overlaps the flanging structure 111, so that a sealed accommodating cavity 150 is formed between the upper cover 120 and the lower housing 110, so that the fan 193 forms internal circulation heat dissipation air in the sealed accommodating cavity 150 so that heat generated by the power components 191 is evenly distributed in the sealed accommodation cavity 150 and dust outside the cavity is prevented from entering the sealed accommodation cavity 150 to affect the power components 191.

The lower housing 110 and the upper cover 120 are configured to carry the foregoing mechanical part, to centralize the foregoing mechanical part in the cavity 150, thereby improving structural stability and reliability of the electronic device 100. The upper cover 120 and the lower housing 110 may be sheet metal parts. For example, the upper cover 120 and the lower housing 110 may be sheet metal parts formed through bending, welding, or another process. The sheet metal part is relatively light and thin and has a relatively low cost, which helps reduce a weight of the electronic device 100 and reduce costs of the electronic device 100. In addition, the sheet metal part further has relatively good bending performance, which may facilitate bending of the lower housing 110 and the upper cover 120, so that the lower housing 110 and the upper cover 120 can meet different shape requirements.

As shown in FIG. 1a, a connector (for example, a first connector 160, a second connector 170, or the like in FIG. 1a) may be further disposed on the electronic device 100. One end of the connector may be connected to the electronic device 100, and the other end may be configured to be connected to an external device, so that the electronic device 100 may be connected to the external device by using the connector, to perform energy exchange, transmission, and the like.

Currently, an upper cover and a lower housing of an electronic device may be connected by using a screw fastener. The upper cover and the lower housing with a sheet metal structure are relatively light and thin. In a process of connecting the upper cover and the lower housing by using the screw fastener, a mounting hole may be provided on a front surface or a side surface of the upper cover, a threaded hole opposite to the mounting hole may be provided on the lower housing, and the screw fastener may pass through the mounting hole and be screwed into the threaded hole, so that the upper cover and the lower housing may be connected by using the screw fastener. To improve firmness of connection between the upper cover and the lower housing, a plurality of screw fasteners may be disposed between the upper cover and the lower housing.

However, in the foregoing connection manner, the screw fastener is located on the front surface or the side surface of the upper cover; consequently, an appearance effect of the electronic device is relatively poor, and aesthetics of the electronic device is reduced.

In a related technology, to avoid occurrence of the screw fastener on the front surface or the side surface of the upper cover, the upper cover and the lower housing adopt die casting parts. The die casting part is thick. In this way, a threaded hole may be provided on a surface that is of the upper cover and that faces the lower housing (that is, the bottom of the upper cover), a through hole may be provided on the lower housing, and then the screw fastener extends into the threaded hole of the upper cover in a direction of the lower housing, to implement connection between the upper cover and the lower housing. Therefore, the screw fastener is hidden at the bottom of the upper cover, to avoid the occurrence of the screw fastener on the front surface of the upper cover.

However, hardness and brittleness of the upper cover and the lower housing of a structure of the die casting part are relatively high. When an unexpected situation such as a short circuit occurs in a use process of the electronic device, and a cavity of the electronic device generates an energy shock, plastic deformation is difficult to occur because the hardness and brittleness of the upper cover and the lower housing are relatively high. In this way, the upper cover is prone to fall from the lower housing under an action of the energy shock in the cavity, and even cracks, consequently causing a security accident. Security of the electronic device is greatly reduced.

Based on the foregoing problem, an embodiment provides an electronic device, in which a connection part between an upper cover and a lower housing may be located below the upper cover, thereby effectively avoiding impact on an appearance on the electronic device caused by occurrence of a fastener on a front surface or a side surface of the upper cover, and effectively improving overall aesthetics of the electronic device.

Figure 2:
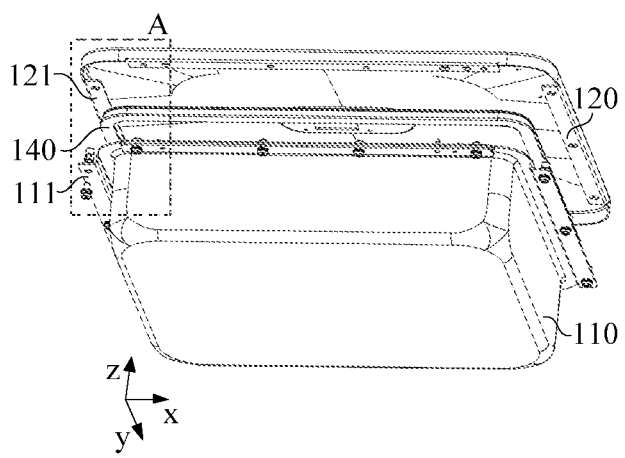
FIG. 2 is a schematic exploded view of an electronic device according to an embodiment.

FIG. 2 is a schematic exploded view of an electronic device according to an embodiment. FIG. 3 is a sectional view of the electronic device according to this embodiment.

In this embodiment, in the accompanying drawings, a direction x represents a length direction of the electronic device 100, a direction y represents a width direction of the electronic device, and a direction z represents a thickness direction of the electronic device.

The electronic device 100 provided in this embodiment is shown in FIG. 2. An upper cover 120 has a bending structure 121 that faces a direction of a lower housing 110, and an end that is of the lower housing 110 and that faces the upper cover 120 has a flanging structure 111. With reference to FIG. 3, the flanging structure 111 and a bottom wall of the bending structure 121 may overlap each other. For example, the flanging structure 111 and the bending structure 121 may overlap in the thickness direction (that is, the direction z in FIG. 3) of the electronic device 100. The upper cover 120 and the lower housing 110 may be connected at an overlapping part of the bending structure 121 and the flanging structure 111.

For example, the bottom wall of the bending structure 121 may be bonded to the flanging structure 111, so that the flanging structure 111 may provide support for the upper cover 120. This helps provide auxiliary positioning and support for installation of the upper cover 120, thereby improving accuracy and reliability of an installation operation between the upper cover 120 and the lower housing 110.

For example, the flanging structure 111 and the bottom wall of the bending structure 121 may be detachably connected in a manner of clamping, fastening, bolt connecting, or the like, so that the upper cover 120 is detachable from the lower housing 110. This may facilitate maintenance of the electronic device 100, and helps improve a service life of the electronic device 100.

As shown in FIG. 3, the upper cover 120 may include a top wall 122 and the bending structure 121 connected to the top wall 122. The bending structure 121 may include a side wall 1211 and a bottom wall 1212 that are disposed at an angle. The side wall 1211 may be located between the top wall 122 and the bottom wall 1212. An edge of the top wall 122 may be sequentially bent twice to form the side wall 1211 and the bottom wall 1212 of the bending structure 121. For example, the edge of the top wall 122 may be bent for a first time along the thickness direction (that is, the direction z in FIG. 3) of the electronic device 100 and towards the lower housing 110 (that is, the direction −z in FIG. 3), to form the side wall 1211 of the bending structure 121. Then, the side wall 1211 is bent for a second time along the length direction (the direction x shown in FIG. 3) of the electronic device 100 and towards a side wall of the lower housing 110, to form the bottom wall 1212 of the bending structure 121, so that the upper cover 120 forms the bending structure 121 after being bent twice.

When an accident (for example, a short circuit) occurs on a mechanical part inside the electronic device 100, and an energy shock is generated inside a cavity 150 of the electronic device 100, after the upper cover 120 is affected by the energy shock, angles between the side wall 1211 and each of the top wall 122 and the bottom wall 1212 may change under an impact force, to change a structural shape of the upper cover 120. For example, the angles between the side wall 1211 and each of the top wall 122 and the bottom wall 1212 may increase, so that the bending structure 121 is unfolded. In this way, a volume of the cavity 150 of the electronic device 100 may be increased, and buffer space is provided for an energy shock in the cavity 150, thereby reducing a pulling force at a connection part between the upper cover 120 and the lower housing 110, avoiding a security accident caused by a crack between the upper cover 120 and the lower housing 110, and helping improve security of the electronic device 100.

The upper cover 120 and the lower housing 110 are connected at an overlapping part of the flanging structure 111 and the bottom wall 1212 of the bending structure 121, so that a connection structure between the upper cover 120 and the lower housing 110 may be hidden at the bottom of the upper cover 120. This effectively avoids occurrence of the connection structure on a side surface or a front surface of the upper cover 120, and avoids impact on an appearance of the electronic device 100 caused by the occurrence of the connection structure on the front surface or the side surface of the upper cover 120, thereby effectively improving external integrity of the electronic device 100, and improving overall aesthetics of the electronic device 100.

Compared with the electronic device in the related technology, in the electronic device 100 in this embodiment, the upper cover 120 has the bending structure 121, and the bending structure 121 may cause the upper cover 120 to deform when an inner part of the electronic device 100 is affected by the energy shock, to increase the volume of the cavity 150 inside the electronic device 100, thereby providing buffer space for the energy shock, effectively avoiding a crack between the upper cover 120 and the lower housing 110, avoiding occurrence of a security accident, and effectively improving security of the electronic device 100. In addition, a structure for enhancing structural strength of the upper cover 120 and the lower housing 110 that is disposed in the electronic device 100 may be omitted, so that the structure of the upper cover 120 and the lower housing 110 may be effectively simplified, and a cost of the electronic device 100 may be reduced.

Figure 4:
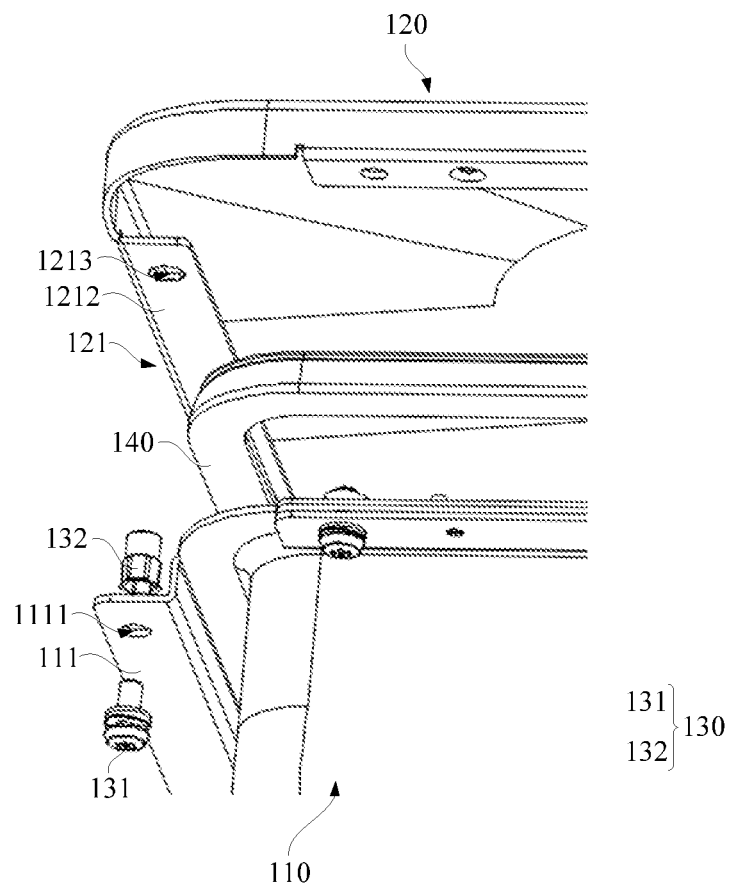
FIG. 4 is an enlarged view of an area A in FIG. 2.

FIG. 4 is an enlarged view of an area A in FIG. 2.

As shown in FIG. 4, the electronic device 100 may further include a fastening assembly 130. The bottom wall 1212 of the bending structure 121 and the flanging structure 111 may be connected at the overlapping part by using the fastening assembly 130. For example, the fastening assembly 130 may be a bolt fastening assembly, a screw fastening assembly, or the like. A connection manner of the fastening assembly 130 is simple. This may simplify a connection on the upper cover 120 and the lower housing 110. In addition, the fastening assembly 130 provides reliable connection and is easy to disassemble. This may effectively improve reliability and firmness of connection between the upper cover 120 and the lower housing 110, and may further facilitate disassembly between the upper cover 120 and the lower housing 110, thereby facilitating repair and maintenance of the electronic device 100.

Still as shown in FIG. 4, for example, the fastening assembly 130 may include a bolt component 131 and a nut component 132 that fit with each other. A first assembly hole 1213 may be provided on the bottom wall 1212 of the bending structure 121, a second assembly hole 1111 opposite to the first assembly hole 1213 may be provided on the flanging structure 111, and a stud of the bolt component 131 may pass through the first assembly hole 1213 and the second assembly hole 1111 and fits with the nut component 132, so that the upper cover 120 and the lower housing 110 may be connected through fitting between the bolt component 131 and the nut component 132. One of the bolt component 131 and the nut component 132 may be fastened to an inner side of the bottom wall 1212 of the bending structure 121.

For example, the nut component 132 may be fastened to the inner side of the bottom wall 1212, and then the stud of the bolt component 131 sequentially passes through the second assembly hole 1111 and the first assembly hole 1213, to fit with the nut component 132, so that the upper cover 120 and the lower housing 110 are connected through fitting between the bolt component 131 and the nut component 132. Alternatively, the bolt component 131 may be fastened to the inner side of the bottom wall 1212. For example, a head of the bolt component 131 may be fastened to the inner side of the bottom wall 1212, and then the stud of the bolt component 131 sequentially passes through the first assembly hole 1213 and the second assembly hole 1111 and extends out of an outer side of the flanging structure 111, so that the nut component 132 may fit with the protruding stud, and the upper cover 120 and the lower housing 110 may be connected through fitting between the bolt component 131 and the nut component 132.

One of the bolt component 131 and the nut component 132 is fastened to the inner side of the bottom wall 1212. In this way, when the nut component 132 and the bolt component 131 are fastened and fitted, only one of the fasteners needs to be rotated to implement fastening and fitting of the nut component 132 and the bolt component 131, and no auxiliary fastening is required for a fastener fastened to the inner side of the bottom wall 1212. This effectively reduces operation difficulty of fitting the fastening assembly 130, helps improve tightness of fitting the fastening assembly 130, and improves firmness and reliability of connection between the upper cover 120 and the lower housing 110.

The bolt component 131 and the nut component 132 may be fastened to the inner side of the bottom wall 1212 of the bending structure 121 in a manner of welding, bonding, clamping, or fastening, or the bolt component 131 and the nut component 132 may be fastened to the inner side of the bottom wall 1212 in another connection manner.

For example, in a possible implementation, the nut component 132 may be a self-clinching nut or a rivet nut, and the nut component 132 may be fastened to the inner side of the bottom wall 1212 and disposed coaxially with the first assembly hole 1213. The self-clinching nut is used as an example. One end of the self-clinching nut has an embossing tooth, and the end of the self-clinching nut having the embossing tooth is pressed into the bottom wall 1212 of the flanging structure 111, so that plastic deformation may occur on the bottom wall 1212, and the self-clinching nut may be connected to the bottom wall 1212 through fastening by using the embossing tooth. In this case, the stud of the bolt component 131 may sequentially pass through the second assembly hole 1111 and the first assembly hole 1213, and extend into the self-clinching nut fastened to the inner side of the bottom wall 1212. The bolt component 131 and the nut component 132 may be fastened and fitted by rotating the bolt component 131, so that the upper cover 120 and the lower housing 110 may be connected through fitting between the bolt component 131 and the nut component 132.

Correspondingly, a use principle of the rivet nut is similar to a use principle of the self-clinching nut. For example, the rivet nut is pulled out to connect the rivet nut and the bottom wall 1212 through fastening, so that the stud of the bolt component 131 may sequentially pass through the second assembly hole 1111 and the first assembly hole 1213, to fit with the self-clinching nut fastened to the inner side of the bottom wall 1212, so as to implement connection between the upper cover 120 and the lower housing 110.

The nut component 132 and the bottom wall 1212 of the bending structure 121 may be connected by using the self-clinching nut or the rivet nut, to fasten the nut component 132. In this way, in a connection process, the stud of the bolt component 131 is extended into the nut component 132 and rotated, so that the bolt component 131 and the nut component 132 may be fastened and fitted, and the nut component 132 does not need to be fastened. This effectively avoids rotation of the nut component 132 with the bolt component 131 in a process of fitting with the bolt component 131, and avoids affecting normal fitting between the nut component 132 and the bolt component 131 caused by the rotation of the nut component 132 with the bolt component 131, thereby effectively improving tightness of fitting the nut component 132 and the bolt component 131, and improving firmness and reliability of connection between the upper cover 120 and the lower housing 110.

In addition, fastened connection operations between the self-clinching nut and the bending structure 121, and between the rivet nut and the bending structure 121 are simple, and the connections are reliable and cause no damage or harm to an overall structure of the upper cover 120. This can effectively improve firmness and reliability of connection between the nut component 132 and the bottom wall 1212, thereby improving reliability and stability of connection between the upper cover 120 and the lower housing 110.

In another possible implementation, the bolt component 131 may be a self-clinching bolt or a rivet bolt, and a head of the bolt component 131 may be fastened to the inner side of the bottom wall 1212 and disposed coaxially with the first assembly hole 1213. The stud of the bolt component 131 may sequentially pass through the first assembly hole 1213 and the second assembly hole 1111 and extend out of an outer side of the flanging structure 111, so that the nut component 132 may fit with the stud. The self-clinching bolt is used as an example. One end that is of the head of the self-clinching bolt and that faces the stud has an embossing tooth. In a use process, the stud of the self-clinching bolt may sequentially pass through the first assembly hole 1213 and the second assembly hole 1111 from an inner side of the bottom wall 1212 to extend out of the outer side of the flanging structure 111, and the end that is of the head of the self-clinching bolt and that has the embossing tooth is pressed into the bottom wall 1212 of the flanging structure 111, so that plastic deformation occurs on the bottom wall 1212, and the head of the self-clinching bolt may be fastened to the bottom wall 1212 by using the embossing tooth. In this case, the nut component 132 is sleeved on a part of the stud that extends out of the outer side of the flanging structure 111 in the self-clinching bolt, and is screwed, so that the nut component 132 can be fastened and connected to the bolt component 131, and the upper cover 120 and the lower housing 110 may be connected through fitting between the nut component 132 and the self-clinching bolt.

Correspondingly, a use principle of the rivet bolt is similar to a use principle of the self-clinching bolt. For example, the rivet bolt is pulled out to connect the head of the rivet bolt to the bottom wall 1212 through fastening, so that a stud part of the rivet bolt may extend out of the outer side of the flanging structure 111, and the nut component 132 can be fastened and fitted with the stud part.

The bolt component 131 may be fastened to the bottom wall 1212 of the bending structure 121 by using the self-clinching bolt or the rivet bolt. In this way, in a connection process, the nut component 132 may be directly sleeved on the stud of the bolt component 131 and the nut component 132 is rotated, so that the nut component 132 and the bolt component 131 may be fastened and fitted, and the bolt component 131 does not need to be fastened. This effectively avoids rotation of the bolt component 131 in a process of fitting with the nut component 132, and avoids affecting normal fitting between the bolt component 131 and the nut component 132 caused by the rotation of the bolt component 131 with the nut component 132, thereby effectively improving tightness of fitting the bolt component 131 and the nut component 132, and improving firmness and reliability of connection between the upper cover 120 and the lower housing 110.

Still as shown in FIG. 4, the electronic device 100 may further include a sealing element 140. The sealing element 140 may be disposed between the upper cover 120 and the lower housing 110. The sealing element 140 may play a sealing role for connection between the upper cover 120 and the lower housing 110, avoid entering of external stains such as water stains and oil stains into the cavity 150 of the electronic device 100, and prevent the stains from entering the cavity 150 to affect normal operation of the electronic device 100, thereby helping improve stability and security of the electronic device 100.

Figure 5:
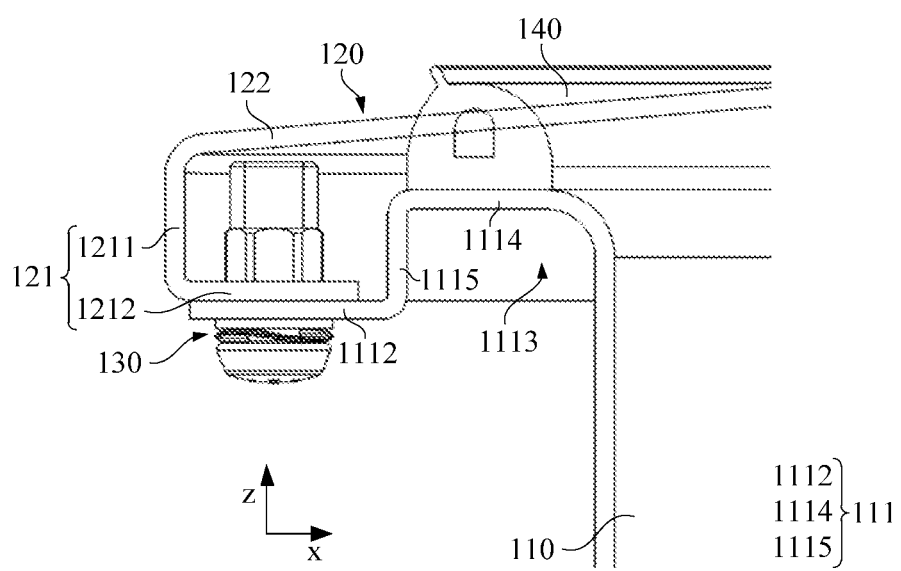
FIG. 5 is an enlarged view of an area B in FIG. 3.
Figure 5A:
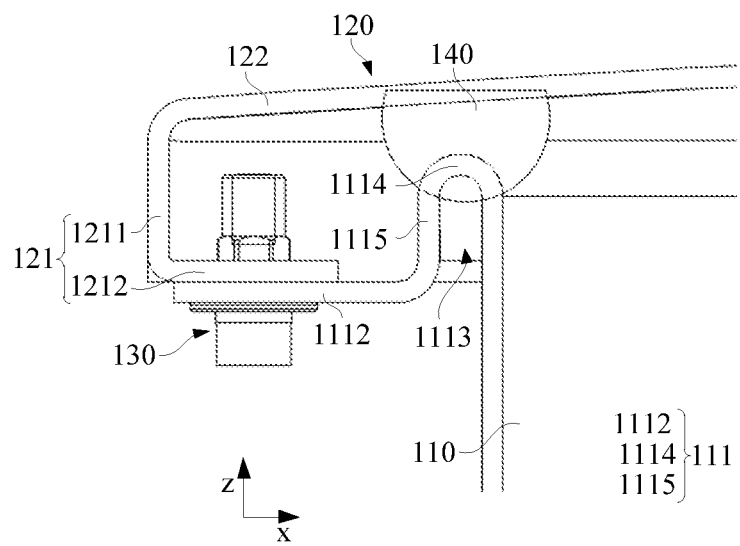
FIG. 5a is a schematic diagram of a partial structure of a sealing element disposed on an upper cover according to an embodiment.

FIG. 5 is an enlarged view of an area B in FIG. 3. FIG. 5*a* is a schematic diagram of a partial structure of the sealing element disposed on the upper cover according to this embodiment.

As shown in FIG. 5, in a possible implementation, the flanging structure 111 may have a first flip surface 1112 parallel to the bottom wall 1212 of the bending structure 121, and the bottom wall 1212 of the bending structure 121 may be bonded to the first flip surface 1112. The bending structure 121 and the flanging structure 111 may be connected at an overlapping part of the first flip surface 1112 and the bottom wall 1212. For example, the second assembly hole 1111 on the flanging structure 111 may be provided on the first flip surface 1112. In a connection process of the upper cover 120 and the lower housing 110, the bottom wall 1212 of the bending structure 121 may be bonded to the first flip surface 1112 of the flanging structure 111, and the first assembly hole 1213 is opposite to the second assembly hole 1111, so that the stud of the bolt component 131 may sequentially pass through the first assembly hole 1213 and the second assembly hole 1111.

The first flip surface 1112 is parallel to the bottom wall 1212, so that the first flip surface 1112 may be more closely attached to the bottom wall 1212, a fitting and attachment degree between the bending structure 121 and the flanging structure 111 can be effectively improved, and a coaxiality between the first assembly hole 1213 and the second assembly hole 1111 can be improved, thereby facilitating fastening and fitting between the bolt component 131 and the nut component 132, helping improve firmness and reliability of fitting between the nut component 132 and the bolt component 131, and improving reliability and stability of connection between the upper cover 120 and the lower housing 110.

Still as shown in FIG. 5, a side wall of the lower housing 110 may be flipped outwards to form the flanging structure 111. The flanging structure 111 is concave towards a direction of the cavity 150 of the electronic device 100 to form a recess part 1113, and the recess part 1113 may be configured to protrude outwards when an impact force is exerted inside the lower housing 110, to increase the volume of the cavity 150 of the electronic device 100. For example, when an accident occurs on a mechanical part inside the electronic device 100, and an energy shock is generated inside the cavity 150, the recess part 1113 on the flanging structure 111 may deform to protrude outwards under the impact force when affected by the energy shock. In this way, the volume of the cavity 150 of the electronic device 100 may be increased, and buffer space can be provided for an energy shock in the cavity 150, thereby effectively reducing a pulling force at a connection part between the upper cover 120 and the lower housing 110, effectively reducing or avoiding a crack between the upper cover 120 and the lower housing 110, preventing a security accident caused by the crack between the upper cover 120 and the lower housing 110, and effectively improving security of the electronic device 100.

Still as shown in FIG. 5, the flanging structure 111 may further include a second flip surface 1114 connected to the first flip surface 1112. The second flip surface 1114 may be located on a side that is of the first flip surface 1112 and that is close to the side wall of the lower housing 110, and the second flip surface 1114 may be located on a side that is of the first flip surface 1112 and that faces the cavity 150, so that the second flip surface 1114 is concave towards the cavity 150 to form the recess part 1113.

For example, as shown in FIG. 5, a connection surface 1115 may be provided between the first flip surface 1112 and the second flip surface 1114, and the first flip surface 1112 and the second flip surface 1114 may be connected through the connection surface 1115. In a flipping process, the side wall of the lower housing 110 may be first flipped outwards (that is, a direction backward to the cavity 150 of the electronic device 100), for example, may be flipped along the length direction of the electronic device 100 (that is, the direction x in FIG. 5) and backward to the cavity 150 of the electronic device 100 (that is, the direction −x in FIG. 5), to form the second flip surface 1114. Then, the second flip surface 1114 is flipped in a direction backward to the upper cover 120, for example, may be flipped in the thickness direction of the electronic device 100 (that is, the direction z in FIG. 5) and backward to the upper cover 120 (that is, the direction −z in FIG. 5), to form the connection surface 1115, so that the connection surface 1115 is located on a side that is of the second flip surface 1114 and that is backward to the upper cover 120. Finally, the connection surface 1115 is continuously flipped outwards to form the first flip surface 1112. For example, a flipping direction of the connection surface 1115 may be parallel to a flipping direction of the side wall of the lower housing 110, to form the first flip surface 1112, so that the first flip surface 1112 is located on a side that is of the second flip surface 1114 and that is away from the cavity 150, and the second flip surface 1114 may be concave to form a recess part 1113.

When an accident occurs in the electronic device 100, and an energy shock is generated inside the cavity 150, a position relationship between the first flip surface 1112, the connection surface 1115, and the second flip surface 1114 of the flanging structure 111 may change under an effect of the energy shock. The second flip surface 1114 may protrude outwards under an impact force, so that the second flip surface 1114 is located on a side that is of the first flip surface 1112 and that is away from the cavity 150, to increase the volume of the cavity 150, thereby achieving an energy buffering effect, and avoiding a crack between the upper cover 120 and the lower housing 110 under the effect of the energy shock.

The sealing element 140 may be located between the second flip surface 1114 and the upper cover 120. For example, the sealing element 140 may be disposed on the second flip surface 1114 in a manner shown in FIG. 5. For example, the sealing element 140 may be disposed on the second flip surface 1114 in a manner of bonding, clamping, or fastening. The manner of bonding is used as an example. A bonding layer may be disposed on a surface that is of the sealing element 140 and that faces the second flip surface 1114, and the sealing element 140 may be bonded to the second flip surface 1114 by using the bonding layer.

Alternatively, as shown in FIG. 5a, the sealing element 140 may be further disposed on the upper cover 120. For example, the sealing element 140 may be disposed on the upper cover 120 in a manner of bonding, clamping, or fastening. For example, a bonding layer may be disposed on a side that is of the sealing element 140 and that faces the upper cover 120, and the sealing element 140 may be bonded to the upper cover 120 by using the bonding layer. In a process of disposing the sealing element 140 on the upper cover 120, the sealing element 140 may be located at a part that is on the top wall 122 of the upper cover 120 and that is opposite to the second flip surface 1114, so that the sealing element 140 may be clamped between the top wall 122 of the upper cover 120 and the second flip surface 1114 when the upper cover 120 is disposed to cover the lower housing 110. Therefore, the sealing element 140 may be in a compressed state between the second flip surface 1114 and the top wall 122. This improves a sealing effect between the upper cover 120 and the lower housing 110, and helps improve waterproof performance of the electronic device 100.

The second flip surface 1114 is located on a side that is of the first flip surface 1112 and that is close to the upper cover 120, so that a distance between the second flip surface 1114 and the upper cover 120 is relatively small. The sealing element 140 is disposed on the second flip surface 1114, so that a compression amount of the sealing element 140 may be effectively increased, and a sealing effect of connection between the sealing element 140 and each of the upper cover 120 and the lower housing 110 may be effectively improved, thereby improving sealing performance between the upper cover 120 and the lower housing 110. In addition, this further helps improve firmness and reliability of the sealing element 140, effectively reduce or avoid deviation of the sealing element 140, and improve reliability and stability of sealing between the upper cover 120 and the lower housing 110.

It should be noted that, the sealing element 140 in FIG. 5 is a structural state of the sealing element 140 when the sealing element 140 is not squeezed by the upper cover 120 and the lower housing 110. The sealing element 140 is an elastic element. In an actual use process, elastic deformation occurs on the sealing element 140 under an extrusion effect of the upper cover 120 and the lower housing 110, to provide a sealing effect for the electronic device 100.

Figure 6:
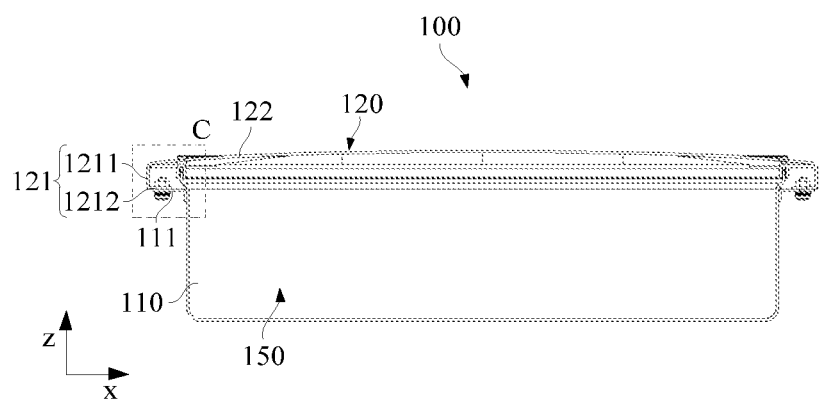
FIG. 6 is a sectional view of another electronic device according to an embodiment.
Figure 7:
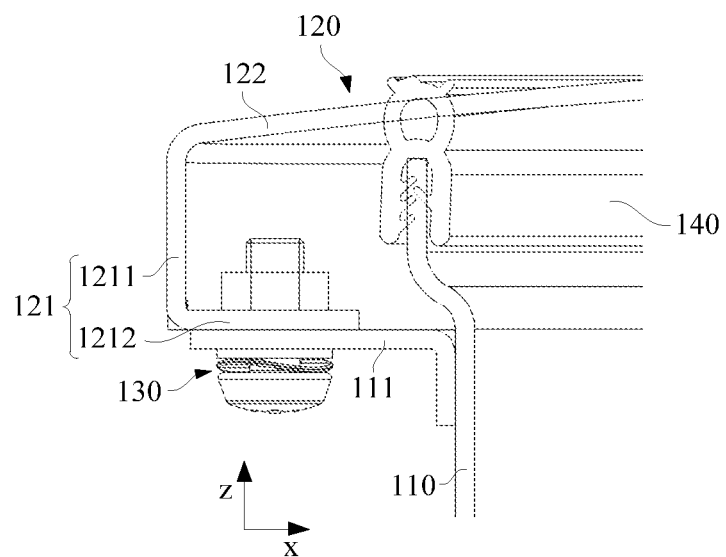
FIG. 7 is an enlarged view of an area C in FIG. 6.

FIG. 6 is a sectional view of another electronic device according to an embodiment. FIG. 7 is an enlarged view of an area C in FIG. 6.

In another possible implementation, as shown in FIG. 6 and FIG. 7, a flanging structure 111 may be further enclosed around a periphery of a side wall of a lower housing 110, and a sealing element 140 may be clamped at an end that is of the side wall of the lower housing 110 and that faces an upper cover 120. For example, the flanging structure 111 may be disposed on the periphery of the side wall of the lower housing 110 in a welding manner, so that a bending structure 121 of the upper cover 120 may be connected to the lower housing 110 by using the flanging structure 111.

A clamping slot may be disposed on the sealing element 140. The clamping slot may be clamped on the side wall of the lower housing 110, so that the sealing element 140 may be fastened to the lower housing 110, and the sealing element 140 may achieve a sealing effect between the upper cover 120 and the lower housing 110. In this way, firmness and reliability of disposing the sealing element 140 on the lower housing 110 may be effectively improved, and fall-off of the sealing element 140 can be effectively avoided, thereby effectively improving reliability and stability of disposing the sealing element 140, and improving sealing performance of the electronic device 100.

Still as shown in FIG. 7, the side wall of the lower housing 110 may protrude outwards, to increase a volume of a cavity 150 of the electronic device 100, thereby providing buffer space for an energy shock inside the electronic device 100, reducing an impact force of the energy shock on the upper cover 120 and the lower housing 110, and improving security of the electronic device 100.

It should be noted that, the sealing element 140 in FIG. 6 and FIG. 7 is also an initial structural state of the sealing element 140. In an actual use process, the sealing element 140 undergoes elastic deformation between the upper cover 120 and the lower housing 110, instead of being in the state in FIG. 6 and FIG. 7.

In descriptions of the embodiments, it should be noted that, unless otherwise clearly specified and limited, the terms "installation", "connection to", and "connection" should be understood in a broad sense. For example, the connection may be a fixed connection, may be an indirect connection by using an intermediate medium, or may be an internal connection between two elements or an interaction relationship between two elements. For persons of ordinary skill in the art, specific meanings of the foregoing terms in the embodiments may be understood based on a specific situation. The terms "first", "second", "third", "fourth", and the like (if any) are intended to distinguish between similar objects but do not necessarily indicate an order or sequence.

Finally, it should be noted that the foregoing embodiments are merely intended for describing the embodiments rather than limiting the embodiments. Although described in detail with reference to the foregoing embodiments, persons of ordinary skill in the art should understand that they may still make modifications to without departing from the scope of the solutions of the embodiments.

What is claimed is:

1. A photovoltaic inverter, comprising: a lower housing; an upper cover, which has a bending structure that faces a direction of the lower housing, an end of which faces the upper cover has a flanging structure, the flanging structure overlaps a bottom wall of the bending structure, and the upper cover and the lower housing are connected at an overlapping part of the bending structure and the flanging structure, so that a sealed accommodating cavity is formed between the upper cover and the lower housing; a fan; power components; a circuit board, on which the fan and the power components are configured to be installed; module terminals, disposed on a side wall or a bottom wall of the lower housing, and a part of the module terminals located outside the lower housing is configured to connect to a photovoltaic module, and a part of the module terminals located inside the lower housing is configured to connect to the circuit board, and are configured to transmit power of the photovoltaic module to the power component through the circuit board; wherein the fan is configured to form internal circulating heat dissipation air in the sealed accommodating cavity so as to evenly distribute heat generated by the power components in the sealed accommodation cavity; and prevent dust outside from entering the sealed accommodation cavity and affecting the power components; and a bolt component and a nut component that fit with each other; a first assembly hole is provided on the bottom wall of the bending structure, a second assembly hole opposite to the first assembly hole is provided on the flanging structure, and a stud of the bolt component passes through the first assembly hole and the second assembly hole and fits with the nut component; and one of the bolt component and the nut component is fastened to an inner side of the bottom wall of the bending structure which is facing to the cover.

2. The photovoltaic inverter according to claim 1, wherein the nut component is a self-clinching nut or a rivet nut, and the nut component is fastened to the inner side of the bottom wall and is coaxially disposed with the first assembly hole; and the stud of the bolt component sequentially passes through the second assembly hole and the first assembly hole and fits with the nut component.

3. The photovoltaic inverter according to claim 1, wherein the bolt component is a self-clinching bolt or a rivet bolt, a head of the bolt component is fastened to the inner side of the bottom wall, and the stud of the bolt component sequentially passes through the first assembly hole and the second assembly hole and extends out of an outer side of the flanging structure, to fit with the nut component.

4. The photovoltaic inverter according to claim 1, further comprising:
a sealing element, wherein the sealing element is disposed between the upper cover and the lower housing.

5. The photovoltaic inverter according to claim 4, wherein the flanging structure has a first flip surface parallel to the bottom wall of the bending structure, and the bottom wall of the bending structure is bonded to the first flip surface; and
the bending structure and the flanging structure are connected at an overlapping part of the first flip surface and the bottom wall.

6. The photovoltaic inverter according to claim 5, wherein a side wall of the lower housing is flipped outwards to form the flanging structure; and
the lower housing and the upper cover are enclosed to form a cavity, the flanging structure is concave towards a direction of the cavity to form a recess part, and the recess part is configured to protrude outwards when an impact force is exerted inside the lower housing, to increase a volume of the cavity.

7. The photovoltaic inverter according to claim 6, wherein the flanging structure further comprises:
a second flip surface connected to the first flip surface; and
the second flip surface is located on a side that is of the first flip surface and that is close to the side wall of the lower housing, and the second flip surface is located on a side that is of the first flip surface and that faces the cavity, to enable the second flip surface to be concave towards the cavity to form the recess part.

8. The photovoltaic inverter according to claim 7, wherein the sealing element is located between the second flip surface and the upper cover.

9. The photovoltaic inverter according to claim 5, wherein the flanging structure is enclosed around a periphery of a side wall of the lower housing; and
the sealing element is clamped at an end that is of the side wall of the lower housing and that faces the upper cover.

* * * * *